(12) United States Patent
Cheng et al.

(10) Patent No.: US 9,831,208 B2
(45) Date of Patent: Nov. 28, 2017

(54) DRIVING CHIP AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Liang Cheng, Beijing (CN); Peng Qi, Beijing (CN); Lu Zheng, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/787,654

(22) PCT Filed: Mar. 10, 2015

(86) PCT No.: PCT/CN2015/073928
§ 371 (c)(1),
(2) Date: Oct. 28, 2015

(87) PCT Pub. No.: WO2016/054891
PCT Pub. Date: Apr. 14, 2016

(65) Prior Publication Data
US 2016/0104686 A1   Apr. 14, 2016

(30) Foreign Application Priority Data

Oct. 11, 2014   (CN) .......................... 2014 1 0534799

(51) Int. Cl.
*H01L 23/48*   (2006.01)
*H01L 23/00*   (2006.01)

(52) U.S. Cl.
CPC .............. *H01L 24/17* (2013.01); *H01L 24/14* (2013.01); *H01L 2224/14132* (2013.01);
(Continued)

(58) Field of Classification Search
CPC . H01L 2224/14135; H01L 2224/14177; H01L 2224/14132; H01L 2224/14133;
(Continued)

(56) References Cited

U.S. PATENT DOCUMENTS 6,963,385 B2 *  11/2005  Aruga ................. G02F 1/13452
                                                                       257/690
7,061,117 B2 *   6/2006  Yang ....................... H01L 23/50
                                                                       257/773

(Continued)

FOREIGN PATENT DOCUMENTS

CN   1385828 A   12/2002
CN   1470908 A   1/2004
(Continued)

OTHER PUBLICATIONS

International Search Report and Written Opinion both dated Jul. 9, 2015; PCT/CN2015/073928.
(Continued)

*Primary Examiner* — Mohammed Shamsuzzaman
(74) *Attorney, Agent, or Firm* — Ladas & Parry LLP

(57) ABSTRACT

A driving chip and a display device, relating to the technical field of driving chip for displays, are disclosed. A surface of the driving chip has a first edge and a second edge opposite to each other. The driving chip includes connecting bumps and supporting bumps, which are arranged along the first edge to form at least one first bump column, and at either end of the first bump column, there is at least one of the supporting bumps; the connecting bumps and the supporting bumps are arranged along the second edge to form at least one second bump column, and at either end of the second bump column, there is at least one of the supporting bumps. A surface of the driving chip according to embodiments of the invention has bump columns, a supporting bump is disposed at an end of a bump column, and acts to support the
(Continued)

driving chip favorably. Thus, upon bonding and packaging, the driving chip can bear a force in equilibrium as a whole, and occurrence of a problem of impression defectiveness is avoided.

10 Claims, 1 Drawing Sheet

(52) U.S. Cl.
CPC ............ *H01L 2224/14133* (2013.01); *H01L 2224/14135* (2013.01); *H01L 2224/14177* (2013.01); *H01L 2924/12041* (2013.01); *H01L 2924/15788* (2013.01)

(58) Field of Classification Search
CPC .............. H01L 24/14; H01L 24/17; H01L 2924/12041; H01L 2924/15788; G02F 1/1333
USPC .......... 257/737, 786; 349/151, 149, 152, 56; 345/204; 361/773
See application file for complete search history.

(56) References Cited

U.S. PATENT DOCUMENTS

| | | | | |
|---|---|---|---|---|
| 7,224,424 B2* | 5/2007 | Hwang | ............... | G02F 1/13452 257/59 |
| 7,486,284 B2* | 2/2009 | Hwang | ................. | H01L 24/13 345/204 |
| 7,894,033 B2* | 2/2011 | Matsuura | .......... | H01L 23/49838 257/786 |
| 8,299,631 B2* | 10/2012 | Horiguchi | .............. | H05K 1/111 257/778 |
| 2002/0167623 A1* | 11/2002 | Aruga | ................. | G02F 1/13452 349/56 |
| 2003/0202150 A1 | 10/2003 | Lee | | |
| 2009/0268147 A1* | 10/2009 | Tang | ....................... | H01L 24/17 349/151 |
| 2010/0025681 A1* | 2/2010 | Katoh | ................. | G02F 1/13452 257/48 |
| 2012/0080789 A1* | 4/2012 | Shiota | .................... | H01L 24/14 257/737 |
| 2014/0029226 A1* | 1/2014 | Abe | ....................... | H05K 1/111 361/773 |

FOREIGN PATENT DOCUMENTS

| | | |
|---|---|---|
| CN | 102460668 A | 5/2012 |
| CN | 104392976 A | 3/2015 |
| WO | 2014/010868 A1 | 1/2014 |

OTHER PUBLICATIONS

First Chinese Office Action dated Aug. 17, 2016; Appln. No. 201410534799.2.

Second Chinese Office Action dated Mar. 2, 2017; Appln. No. 201410534799.2.

* cited by examiner

DRIVING CHIP AND DISPLAY DEVICE

TECHNICAL FILED

Embodiments of the present invention relate to a driving chip and a display device.

BACKGROUND

The COG (Chip on Glass) packaging technology is to directly install a driving chip (generally (or) called as a driving IC, which usually has an integrated circuit therein) onto a lower glass substrate of a display, so that the required voltage or signal is output to a pixel of the display, and in turn, the degree of twisting of liquid crystal molecules or the pixel color is controlled. In the COG packaging technology, a plurality of output/input bumps are arranged on a surface of the driving chip, and the driving chip and metal traces on the lower glass substrate of the display are electrically connected by an anisotropic conductive film (ACF) or a non-conductive film (NCF).

As illustrated in FIG. 1, in prior art, a driving chip 1 is generally in a rectangular configuration, and a plurality of output/input bumps 2 are arranged at an edge of the driving chip 1 in columns, and connected to a lower glass substrate 4 by conductive corpuscles 3. It is a longer distance from an end of a bump column to an edge of the driving chip 1, and at either end of the driving chip 1, there is no bump for its support. During bonding, when the driving chip bears a greater pressure, it results in the fact that either end of the driving chip is deformed excessively, and there is a risk of overpressure in conductive corpuscles in an anisotropic conductive film on an output/input bump at either end of a bump column. After the pressure is removed, the driving chip will restore its shape, causing such an undesirable phenomenon that the impression at either end is shallower, and the impression in the middle is deeper. When the driving chip bears a smaller pressure, the deformation of either end of the driving chip is larger, the pressure acted upon conductive corpuscles in an anisotropic conductive film on an output/input bump at either end of a bump column is larger, and the impression is deeper; the pressure acted upon other part is smaller, and the impression is shallower. This causes such an undesirable phenomenon that the impression at either end is deeper, and the impression in the middle is shallower.

SUMMARY

According to an embodiment of the present invention, there is provided a driving chip, a surface of which has a first edge and a second edge standing opposite each other; the driving chip includes connecting bumps and supporting bumps, which are arranged along the first edge to form at least one first bump column, and at either end of the first bump column, there is at least one of the supporting bumps; the connecting bumps and the supporting bumps are arranged along the second edge to form at least one second bump column, and at either end of the second bump column, there is at least one of the supporting bumps.

In an example, the driving chip further includes a third edge and a fourth edge opposite to each other, the third edge and the fourth edge intersect with the first edge; and maximum distances between two ends of the first bump column and the second bump column and the third edge and the fourth edge are in a range of 4 to 200 μm.

In an example, a minimum distance between the first bump column and the second bump column is 60% to 70% of a distance between the first edge and the second edge.

In an example, a distance between the connecting bumps that are adjacent, between the connecting bumps and the supporting bumps that are adjacent, or between the supporting bumps that are adjacent is smaller than 200 μm.

In an example, the connecting bumps are input bumps or output bumps.

In an example, the surface of the driving chip further includes a third edge and a fourth edge opposite to each other, the third edge and the fourth edge intersect with the first edge; the connecting bumps and the supporting bumps are arranged along the third edge to form at least one third bump column, at either end of the third bump column, there is at least one of the supporting bumps; the connecting bumps and the supporting bumps are arranged along the fourth edge to form at least one fourth bump column, at either end of the fourth bump column, there is at least one of the supporting humps.

In an example, maximum distances between two ends of the first bump column and the second bump column and the third edge and the fourth edge are in a range of 4 to 350 μm; maximum distances between two ends of the third bump column and the fourth bump column and the first edge and the second edge are in a range of 4 to 200 μm.

In an example, a minimum distance between the first bump column and the second bump column is 60% to 70% of a distance between the first edge and the second edge.

In an example, a distance between the connecting bumps that are adjacent, between the connecting bumps and the supporting bumps that are adjacent, or between the supporting bumps that are adjacent is smaller than 200 μm.

In an example, the connecting bumps are input bumps or output bumps.

In an example, lengths of the first edge and the second edge are larger than lengths of the third edge and the fourth edge.

In an example, a surface of the driving chip is in a shape of a rectangle.

In an example, at least one of the first bump column and the second bump column includes a plurality of bump columns parallel to each other.

In an example, thicknesses of the connecting bumps and the supporting bumps in a direction perpendicular to a surface of the driving chip are equal.

According to an embodiment of the invention, there is further provided a display device, including the driving chip as stated in any of embodiments according to the present invention.

BRIEF DESCRIPTION OF THE DRAWINGS

In order to illustrate the technical solution of the embodiments of the invention more clearly, the drawings of the embodiments will be briefly introduced below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

In the description of the present invention, it is to be noted that, a term "connecting bump" refers to an input bump or output bump for connecting a driving chip and a metal trace on a lower glass substrate of a display panel; "supporting bump" refers to such a bump that is useful for supporting the driving chip on the lower glass substrate of the display panel and does not serve a function of signal or electrical conduction. In addition, terms "first", "second", "third" and "fourth" are only useful for descriptive purpose, and cannot be understood as the indicator or hint of relative importance.

Figure 1:
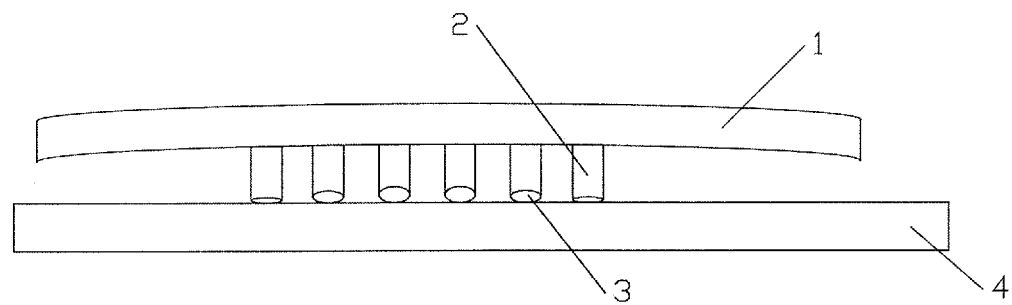
FIG. 1 is a structurally sectional view illustrating the installment of a driving chip in prior art.
Figure 2:
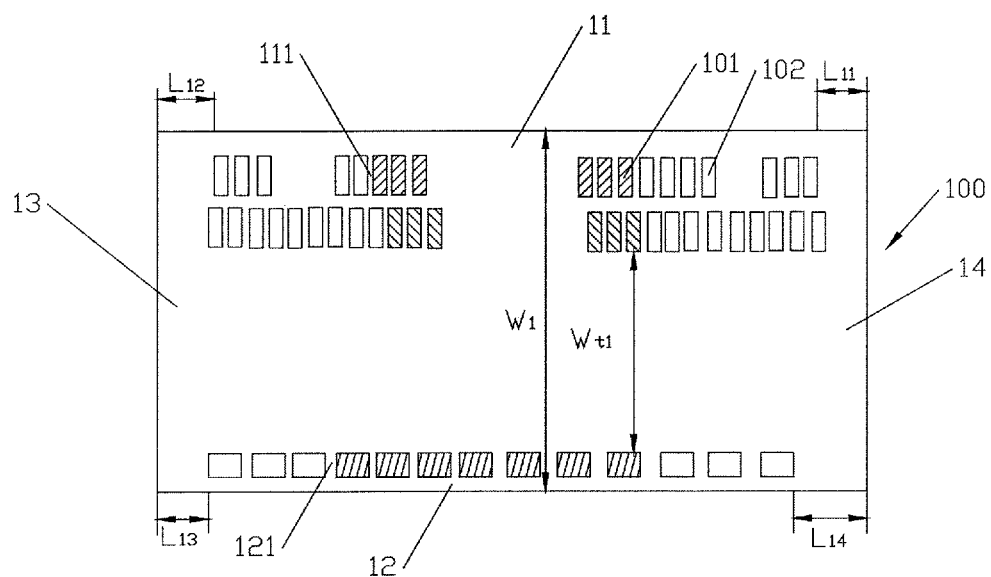
FIG. 2 is a top view illustrating Embodiment 1 for implementing a driving chip according to the present invention.

Referring to that illustrated in FIG. 2, a driving chip 100 according to the present embodiment is a source driving chip or source driving IC, a surface of the driving chip 100 has a first edge 11 and a second edge 12 opposite to each other, and a third edge 13 and a fourth edge 14 opposite to each other, and the third edge 13 and the fourth edge 14 intersect with the first edge 11 and the second edge 12. For example, the first edge 11 and the second edge 12 are parallel to each other, and the third edge 13 and the fourth edge 14 are parallel to each other. The driving chip 100 is illustrated in a rectangular configuration. The driving chip 100 includes a plurality of connecting bumps 101 and a plurality of supporting bumps 102. The plurality of connecting bumps 101 and supporting bumps 102 are arranged along the first edge 11 of the driving chip 100 to form at least one first bump column 111, the first bump column 111 in the embodiment is two columns, and at either end of each of the first bump columns 11, there is at least one supporting bump 102. For example, two first bump columns 111 are parallel to each other. A plurality of connecting bumps 101 and supporting bumps 102 are arranged along the second edge 12 of the driving chip 100 to form at least one second bump column 121. In the present embodiment, the second bump column 121 is one column, and at either end of the second bump column 121, there is at least one supporting bump 102.

For example, the maximum distances between two ends of a first bump column 111 and the third edge 13 and the fourth edge 14 are denoted as $L_{11}$, $L_{12}$, respectively, the maximum distances between two ends of a second bump column 121 and the third edge 13 and the fourth edge 14 are denoted as $L_{13}$, $L_{14}$, respectively, and the value range of $L_{11}$ to $L_{14}$ is 4 to 200 μm. The minimum distance between a first bump column 111 and a second bump column 121 is denoted as $W_{f1}$, and the distance between the first edge 11 and the second edge 12 is denoted as $W_1$, $W_{f1}/W_1$=0.6 to 0.7, namely, the minimum distance between a first bump column 111 and a second bump column 121 is 60% to 70% of the distance between the first edge 11 and the second edge 12. The distance between connecting bumps 101 that are adjacent, a connecting bump 101 and a supporting bump 102 that are adjacent or supporting bumps 102 that are adjacent is smaller than 200 μm. The connecting bumps 101 are input bumps or output bumps.

For example, length of the above first edge 11 and the second edge 12 is larger than length of the third edge 13 and the fourth edge 14.

Figure 3:
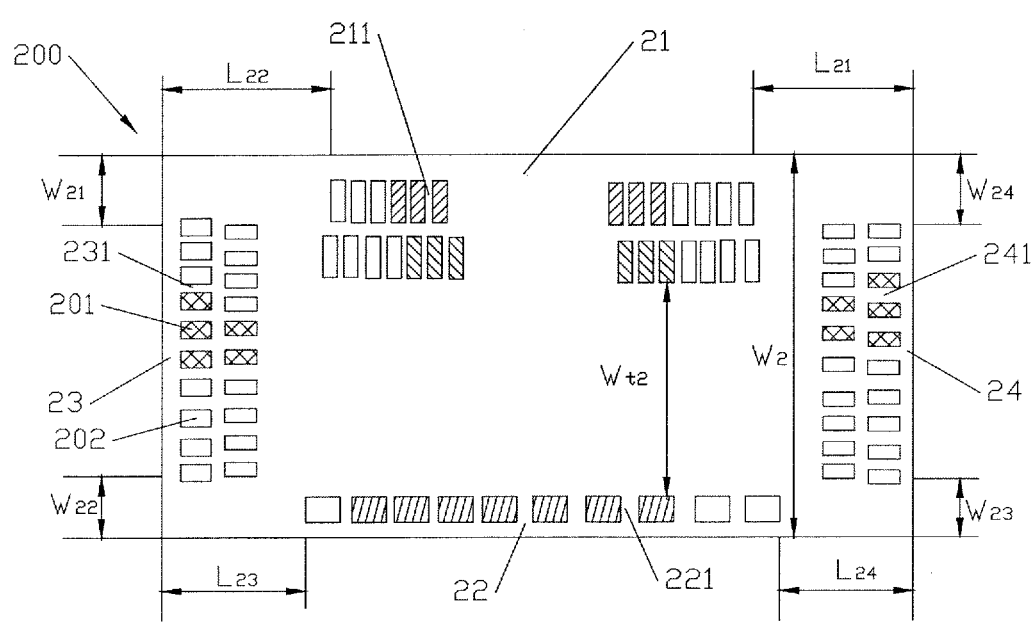
FIG. 3 is a top view illustrating Embodiment 2 for implementing a driving chip according to the present invention.

Referring to that illustrated in FIG. 3, a driving chip 200 according to the present embodiment is a gate driving chip or gate driving IC, and the driving chip 200 is in a rectangular configuration. A surface of the driving chip 200 has a first edge 21 and a second edge 22 opposite to each other, and a third edge 23 and a fourth edge 24 opposite to each other, and the third edge 23 and the fourth edge 24 intersect with the first edge 21 and the second edge 22. For example, the first edge 21 and the second edge 22 are parallel to each other, and the third edge 23 and the fourth edge 24 are parallel to each other. The driving chip 200 is in a rectangular configuration. The driving chip 200 includes a plurality of connecting bumps 201 and a plurality of supporting bumps 202. The plurality of connecting bumps 201 and supporting bumps 202 are arranged along the first edge 21 of the driving chip 200 to form at least one first bump column 211, the first bump column 211 in the embodiment is two columns, and at either end of each of the first bump columns 211, there is at least one supporting bump 202. A plurality of connecting bumps 201 and supporting bumps 202 are arranged along the second edge 22 of the driving chip 100 to form at least one second bump column 221, and the second bump column 221 in the present embodiment is one column. At either end of the second bump column 221, there is at least one supporting bump 202. A plurality of connecting bumps 201 and supporting bumps 202 are arranged along the third edge 11 of the driving chip 200 to form at least one third bump column 231, and the third bump column 231 in the present embodiment is two columns. At either end of each of third bump columns 231, there is at least one supporting bump 202. A plurality of connecting bumps 201 and supporting bumps 202 are arranged along the fourth edge 24 of the driving chip 200 to form at least one fourth bump column 241, and the fourth bump column 241 in the present embodiment is two columns. At either end of each of fourth bump columns 241, there is at least one supporting bump 202. For example, two first bump columns 211 are parallel to each other, two third bump columns 231 are parallel to each other, and two fourth bump columns 241 are parallel to each other.

For example, the maximum distances between two ends of a first bump column 211 and the third edge 23 and the fourth edge 24 are denoted as $L_{21}$, $L_{22}$, respectively, the maximum distances between two ends of a second bump column 221 and the third edge 23 and the fourth edge 24 are denoted as $L_{23}$, $L_{24}$, respectively, and the value range of $L_{21}$ to $L_{24}$ is 4 to 350 μm. The maximum distances between two ends of a third bump column 231 and the first edge 21 and the second edge 22 are denoted as $W_{21}$, $W_{22}$, respectively, the maximum distances between two ends of a fourth bump column 241 and the first edge 21 and the second edge 22 are denoted as $W_{23}$, $W_{24}$, respectively, and the value range of $W_{21}$ to $W_{24}$ is 4 to 200 μm. The minimum distance between a first bump column 211 and a second bump column 221 is denoted as $W_{f2}$, and the distance between the first edge 21 and the second edge 22 is denoted as $W_2$, $W_{f2}/W_2$=0.6 to 0.7, namely, the minimum distance between a first bump column 211 and a second bump column 221 is 60% to 70% of the distance between the first edge 21 and the second edge 22. The distance between connecting bumps 201 that are adjacent, between a connecting bump 201 and a supporting bump 202 that are adjacent or between supporting bumps 202 that are adjacent is smaller than 200 μm. The connecting bumps 201 are input bumps or output bumps.

For example, length of the above first edge 21 and the second edge 22 is larger than length of the third edge 23 and the fourth edge 24.

A surface of the driving chip according to the invention has a plurality of connecting bumps and supporting bumps, and they are arranged at an edge of the driving chip to form bump column(s). The supporting bumps are disposed at the end of a bump column, and act to support the driving chip favorably. Upon bonding and packaging, it is possible that the driving chip bears a force in equilibrium as a whole. When the pressure is overlarge or smaller, supporting bumps at two ends of a bump column can play a supporting rule, so as to avoid the occurrence of such an undesirable problem that the impression in the middle of the driving chip is shallower and the impression at either end is deeper, or, the impression at either end is shallower and the impression in the middle is deeper.

Although rectangle-shaped driving chips have only been described in the above embodiments as an example, embodiments according to the present invention are not limited thereto. Rather, they can have any suitable shape. As for the connecting bumps and supporting bumps in the above embodiments, their thicknesses (i.e. sizes in a direction perpendicular to a surface of the driving chip) may be equal to each other, so that connecting bumps and supporting bumps can serve a supporting function jointly, and in turn, the driving chip is more stable after it is packaged. In the above embodiments, descriptions have been made on a case where supporting bumps are disposed at both ends of a bump column, but embodiments according to the invention are not limited thereto. It may also be the case that a supporting bump is disposed in the middle of a bump column or between connecting bumps. For example, if the distance between connecting bumps in a bump column is larger, then in this case, a supporting bump may be further disposed between connecting bumps, so as to support the driving chip better. For example, each of the connecting bumps and the supporting bumps is disposed on a surface of the driving chip that faces a glass substrate upon packaging.

According to the present invention, there is further provided a display device with the driving chip as stated in any of the above embodiments mounted thereon. The display device may be a liquid crystal panel, an electronic paper, an OLED panel, a liquid crystal television, a liquid crystal display, a digital photo frame, a cell phone, a tablet computer or any other product or component having a display function.

Descriptions made above are merely exemplary embodiments of the invention, but are not used to limit the protection scope of the invention. The protection scope of the invention is determined by attached claims.

This application claims the benefit of priority from Chinese patent application No. 201410534799.2, filed on Oct. 11, 2014, the disclosure of which is incorporated herein in its entirety by reference as a part of the present application.

The invention claimed is:

1. A driving chip, a surface of the driving chip having a first edge and a second edge opposite to each other, the driving chip comprising a plurality of connecting bumps and a plurality of supporting bumps, wherein,
   a first set of connecting bumps and supporting bumps of the plurality of connection bumps and the plurality of supporting bumps are arranged along the first edge to form at least one first bump column, and at either end of the first bump column, there is at least one of the supporting bumps;
   a second set of connecting bumps and supporting bumps of the plurality of connection bumps and the plurality of supporting bumps are arranged along the second edge to form at least one second bump column, and at either end of the second bump column, there is at least one of the supporting bumps,
   wherein the surface of the driving chip further includes a third edge and a fourth edge opposite to each other, the third edge and the fourth edge intersect with the first edge,
   wherein maximum distances between two ends of the first bump column and the second bump column and the third edge and the fourth edge are in a range of 4 to 350 µm; and
   wherein a third set of connecting bumps and supporting bumps of the plurality of connection bumps and the plurality of supporting bumps are arranged along the third edge to form at least one third bump column, at either end of the third bump column, there is at least one of the supporting bumps;
   a fourth set of connecting bumps and supporting bumps of the plurality of connection bumps and the plurality of supporting bumps are arranged along the fourth edge to form at least one fourth bump column, at either end of the fourth bump column, there is at least one of the supporting bumps.

2. The driving chip claimed as claim 1, wherein the maximum distances between two ends of the first bump column and the second bump column and the third edge and the fourth edge are in a range of 4 to 200 µm.

3. The driving chip claimed as claim 1, wherein, maximum distances between two ends of the third bump column and the fourth bump column and the first edge and the second edge are in a range of 4 to 200 µm.

4. The driving chip claimed as claim 1, wherein, a distance between the first bump column and the second bump column is 60% to 70% of a distance between the first edge and the second edge.

5. The driving chip claimed as claim 1, wherein, in any set of the first, second, third, and fourth sets of connecting bumps and supporting bumps, a distance between the connecting bumps that are adjacent, between the connecting bumps and the supporting bumps that are adjacent, or between the supporting bumps that are adjacent is smaller than 200 µm.

6. The driving chip claimed as claim 1, wherein, in any set of the first, second, third, and fourth sets of connecting bumps and supporting bumps, the connecting bumps are input bumps or output bumps.

7. The driving chip claimed as claim 1, wherein, lengths of the first edge and the second edge are larger than lengths of the third edge and the fourth edge.

8. The driving chip claimed as claim 1, wherein, a surface of the driving chip is in a shape of a rectangle.

9. The driving chip claimed as claim 1, wherein, at least one of the first bump column and the second bump column includes a plurality of bump columns parallel to each other.

10. The driving chip claimed as claim 1, wherein, in any set of the first, second, third, and fourth sets of connecting bumps and supporting bumps, thicknesses of the connecting bumps and the supporting bumps in a direction perpendicular to the surface of the driving chip are equal.

* * * * *